United States Patent
Park et al.

(10) Patent No.: US 9,880,248 B2
(45) Date of Patent: Jan. 30, 2018

(54) MAGNETIC RESONANCE IMAGING APPARATUS AND METHOD

(71) Applicants: SAMSUNG ELECTRONICS CO., LTD., Suwon-si (KR); Korea University Research and Business Foundation, Seoul (KR)

(72) Inventors: Su-hyung Park, Seoul (KR); Yeol-min Seong, Seoul (KR); Sang-cheon Choi, Seoul (KR)

(73) Assignees: SAMSUNG ELECTRONICS CO., LTD., Suwon-si (KR); Korea University Research and Business Foundation, Seoul (KR)

(*) Notice: Subject to any disclaimer, the term of this patent is extended or adjusted under 35 U.S.C. 154(b) by 568 days.

(21) Appl. No.: 14/516,712

(22) Filed: Oct. 17, 2014

(65) Prior Publication Data
US 2015/0108979 A1 Apr. 23, 2015

(30) Foreign Application Priority Data

Oct. 18, 2013 (KR) .................. 10-2013-0124925

(51) Int. Cl.
*G01V 3/00* (2006.01)
*G01R 33/561* (2006.01)
(Continued)

(52) U.S. Cl.
CPC ..... *G01R 33/5612* (2013.01); *G01R 33/3852* (2013.01); *G01R 33/4818* (2013.01); *G01R 33/5611* (2013.01)

(58) Field of Classification Search
CPC .............. G01R 33/543; G01R 33/5659; G01R 33/3415; G01R 33/36
(Continued)

(56) References Cited

U.S. PATENT DOCUMENTS

| 6,841,998 B1 | 1/2005 | Griswold | |
|---|---|---|---|
| 2006/0273792 A1* | 12/2006 | Kholmovski | G01R 33/5611 324/309 |

(Continued)

FOREIGN PATENT DOCUMENTS

| JP | 2013-521955 A | 6/2013 |
|---|---|---|
| KR | 10-1283532 B1 | 7/2013 |

(Continued)

OTHER PUBLICATIONS

Park et al., "Generalized High-Pass-Filtered GRAPPA Reconstruction", XP055162895, Proc. Intl. Soc. Mag. Reson. Med. 20, 2012, 1 page.

(Continued)

*Primary Examiner* — Walter L Lindsay, Jr.
*Assistant Examiner* — Frederick Wenderoth
(74) *Attorney, Agent, or Firm* — Sughrue Mion, PLLC

(57) ABSTRACT

A magnetic resonance imaging (MRI) apparatus and method are provided. The MRI apparatus includes a first interpolator configured to generate a plurality of first interpolation data by performing calibration on a plurality of undersampled K-space data obtained from a plurality of channel coils in a radio frequency (RF) multi-coil, respectively, and a second interpolator configured to generate a plurality of second interpolation data by performing calibration on a plurality of filtered data obtained by filtering the first interpolation data using a plurality of high-pass filters.

17 Claims, 9 Drawing Sheets

(51) Int. Cl.
*G01R 33/385* (2006.01)
*G01R 33/48* (2006.01)

(58) Field of Classification Search
USPC .......................................................... 324/309
See application file for complete search history.

(56) References Cited

U.S. PATENT DOCUMENTS

| | | | |
|---|---|---|---|
| 2008/0298661 A1* | 12/2008 | Huang | G01R 33/5611 |
| | | | 382/131 |
| 2009/0224759 A1 | 9/2009 | Kholmovski et al. | |
| 2012/0092009 A1* | 4/2012 | Zhang | G01R 33/5611 |
| | | | 324/309 |
| 2013/0300413 A1 | 11/2013 | Hwang et al. | |

FOREIGN PATENT DOCUMENTS

| | | |
|---|---|---|
| KR | 10-1310825 B1 | 10/2013 |
| WO | 2008137783 A2 | 11/2008 |

OTHER PUBLICATIONS

Huang et al., "High-Pass GRAPPA: An Image Support Reduction Technique for Improved Partially Parallel Imaging", XP002580957, Magnetic Resonance in Medicine, 2008, 8 pages.
Park et al., "Artifact and Noise Suppression in GRAPPA Imaging Using Improved k-Space Coil Calibration and Variable Density Sampling", Magnetic Resonance in Medicine, 2005, 8 pages.
Zhao et al., "Iterative GRAPPA (iGRAPPA) for Improved Parallel Imaging Reconstruction", XP055162898, Magnetic Resonance in Medicine, 2008, 6 pages.
Miao et al., "Geographically Weighted GRAPPA Reconstruction and Its Evaluation with Perceptual Difference Model (Case-PDM)", XP055162899, Proc. Intl. See. Mag. Reson. Med. 15, 2007, 1 page.
Communication, Issued by the European Patent Office, dated Jan. 26, 2015, in counterpart European Application No. 14187948.6.
Communication, Issued by the Korean Patent Department, dated Feb. 27, 2015, in counterpart Korean Application No. 10-2013-0124925.

* cited by examiner

MAGNETIC RESONANCE IMAGING APPARATUS AND METHOD

CROSS REFERENCE TO RELATED APPLICATION

This application claims priority from Korean Patent Application No. 10-2013-0124925, filed on Oct. 18, 2013, in the Korean Intellectual Property Office, the disclosure of which is incorporated herein in its entirety by reference.

BACKGROUND

1. Field

Methods and apparatuses consistent with the exemplary embodiments relate to a magnetic resonance imaging (MRI) apparatus and method, and more particularly, to an MRI apparatus and method which are capable of processing a plurality of K-space data in parallel by using a radio frequency multiple coil.

2. Description of the Related Art

An MRI apparatus uses a magnetic field to obtain an image of a subject, and is widely used in order to accurately diagnose diseases because it is capable of showing stereoscopic images of bones, disks, joints, and nerve ligaments at desired angles.

The MRI apparatus is configured to acquire a magnetic resonance (MR) signal and reconstruct the MR signal into an image for output. Specifically, the MRI apparatus acquires an MR signal by using radio frequency (RF) coils, a permanent magnet, and gradient coils. During reconstruction of K-space data, acquired by the RF coils, into an MR image, noise present in the K-space data may be amplified.

In order to output an MR image in which such amplified noise has been removed, the acquired MR signal has to be corrected by performing image processing, such as calibration.

A Generalized Auto-calibrating Partially Parallel Acquisition (GRAPPA) technique based on a K-space is an MRI method for processing an acquired MR signal.

The GRAPPA technique that is a K-space-based imaging method includes computing spatial correlation coefficients or convolution kernel coefficients that are spatial interaction values between a calibration signal and an adjacent measured source signal by performing self-calibration and estimating unmeasured signals by using the calculated spatial correlation coefficients.

In detail, the GRAPPA technique restores missing K-space lines for each channel by using measured signals that are undersampled data and additional auto-calibrating (ACS) lines.

When data of an image signal is damaged due to noise, or spatial interaction values vary, aliasing artifacts and noise amplification may occur in a finally acquired MR image.

Thus, there is a need for an imaging apparatus and method which are capable of reconstructing an MR image having an improved quality by reducing aliasing artifacts and suppressing amplified noise.

SUMMARY

Exemplary embodiments include a magnetic resonance imaging (MRI) apparatus and method adapted to increase the accuracy of reconstructing an MR image, and more particularly, an MRI apparatus and method which are capable of improving an image quality by reducing aliasing artifacts in an MR image and suppressing amplified noise therein.

Additional aspects will be set forth in part in the description which follows and, in part, will be apparent from the description, or may be learned by practice of the presented exemplary embodiments.

According to the one or more of the above exemplary embodiments, an MRI apparatus includes: a first interpolator configured to obtain a plurality of undersampled K-space data from a plurality of channel coils included in a radio frequency (RF) multi-coil, respectively, and initialize the plurality of undersampled K-space data, to generate a plurality of first interpolation data; a filter assembly configured to generate a plurality of filtered data by filtering the plurality of first interpolation data for each of a plurality of frequency bands; a second interpolator configured to generate a plurality of second interpolation data respectively corresponding to the plurality of channel coils by performing calibration by using at least one filtered data selected from the plurality of filtered data; and an image acquirer configured to obtain a final MR image by using the plurality of second interpolation data and filtered data corresponding to a predetermined frequency band from among the plurality of frequency bands.

The filter assembly may further include a low-pass filter configured to generate a plurality of low-pass filtered data by low-pass filtering the plurality of first interpolation data and a high-pass filter assembly including a plurality of high-pass filters, wherein each of the plurality of high-pass filter generate a plurality of high-pass filtered data by high-pass filtering the plurality of first interpolation data.

The high-pass filter assembly may include the plurality of high-pass filters having different filter characteristics.

The second interpolator is configured to calculate a spatial correlation coefficient by performing calibration by using the plurality of high-pass filtered data, obtain missing line data among the undersampled K-space data by using the spatial correlation coefficient, and generate the plurality of second interpolation data which are K-space data that are restored by using the missing line data.

The image acquirer may be configured to combine the low-pass filtered data with the second interpolation data for each of a plurality of channels, to acquire MR images which respectively correspond to the plurality of channels.

The image acquirer may perform an Inverse Fourier Transform on the MR images respectively corresponding to the plurality channels and perform channel synthesization of the MR images respectively corresponding to the plurality of channels, which are obtained after performing the inverse Fourier Transform, to generate the final MR image.

The first interpolator may be configured to calculate a spatial correlation coefficient by using obtained line data and calibration line data among the plurality of undersampled K-space data, acquire missing line data among the undersampled K-space data by using the spatial correlation coefficient, and generate, based on the missing line data, the plurality of first interpolation data that are initially restored K-space data.

The first interpolator may be configured to obtain first data which is undersampled at predetermined intervals from each of the plurality of channel coils and second data which is sampled at Nyquist sampling intervals from a low frequency region of a K-space and combine the first data with the second data, to acquire the undersampled K-space data.

According to the one or more of the above exemplary embodiments, an MRI apparatus includes: a first interpolator configured to initialize a plurality of undersampled K-space data obtained from each of a plurality of channel coils included in an RF multi-coil, respectively, to generate a plurality of first interpolation data; and a second interpolator configured to generate a plurality of second interpolation data by performing calibration by using a plurality of filtered data obtained by filtering the plurality of first interpolation data using a plurality of high-pass filters.

According to the one or more of the above exemplary embodiments, an MRI method using an RF multi-coil including a plurality of channel coils includes: obtaining a plurality of undersampled K-space data from each of the plurality of channel coils, respectively and initializing the plurality of undersampled K-space data, to generate a plurality of first interpolation data; generating a plurality of filtered data by filtering the plurality of first interpolation data in for each of a plurality of frequency bands; generating a plurality of second interpolation data respectively corresponding to the plurality of channel coils by performing calibration by using at least one filtered data selected from the plurality of filtered data; and obtaining a final MR image by using the plurality of second interpolation data and filtered data corresponding to a predetermined frequency band among the plurality of frequency bands.

The generating the plurality of filtered data may include: generating a plurality of low-pass filtered data by low-pass filtering the plurality of first interpolation data by using a low-pass filter; and generating a plurality of high-pass filtered data by high-pass filtering the plurality of first interpolation data by using a plurality of high-pass filters.

The generating the plurality of second interpolation data may include: calculating a spatial correlation coefficient by performing calibration by using the plurality of high-pass filtered data; obtaining missing line data among the undersampled K-space data by using the spatial correlation coefficient; and generating the second interpolation data which are K-space data that is restored by using the missing line data.

The acquiring of the final MR image may include combining the low-pass filtered data with the second interpolation data for each of a plurality of channels, to acquire MR images respectively corresponding to each of the plurality of channels.

The obtaining the final MR image may include: performing an Inverse Fourier Transform on the MR images respectively corresponding to each of the plurality channels; and performing channel synthesization of the MR images respectively corresponding to each of the plurality of channels, which are obtained after performing the inverse Fourier Transform, and generating the final MR image.

The generating the first interpolation data may include: calculating a spatial correlation coefficient by using obtained line data and calibration line data among the undersampled K-space data; obtaining missing line data among the undersampled K-space data by using the spatial correlation coefficient; and generating, based on the missing line data, the first interpolation data which are initially restored K-space data.

The generating the first interpolation data may include: obtaining first data undersampled at predetermined intervals from each of the plurality of channel coils; obtaining second data sampled at Nyquist sampling intervals from a low frequency region of a K-space; and obtaining the undersampled K-space data by combining the first data with the second data.

According to the one or more of the above exemplary embodiments, an MRI method using an RF multi-coil including a plurality of channel coils includes: initializing a plurality of undersampled K-space data obtained from the plurality of channel coils, respectively, to generate a plurality of first interpolation data; and generating a plurality of second interpolation data by performing calibration by using a plurality of filtered data obtained by filtering the plurality of first interpolation data using a plurality of high-pass filters.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
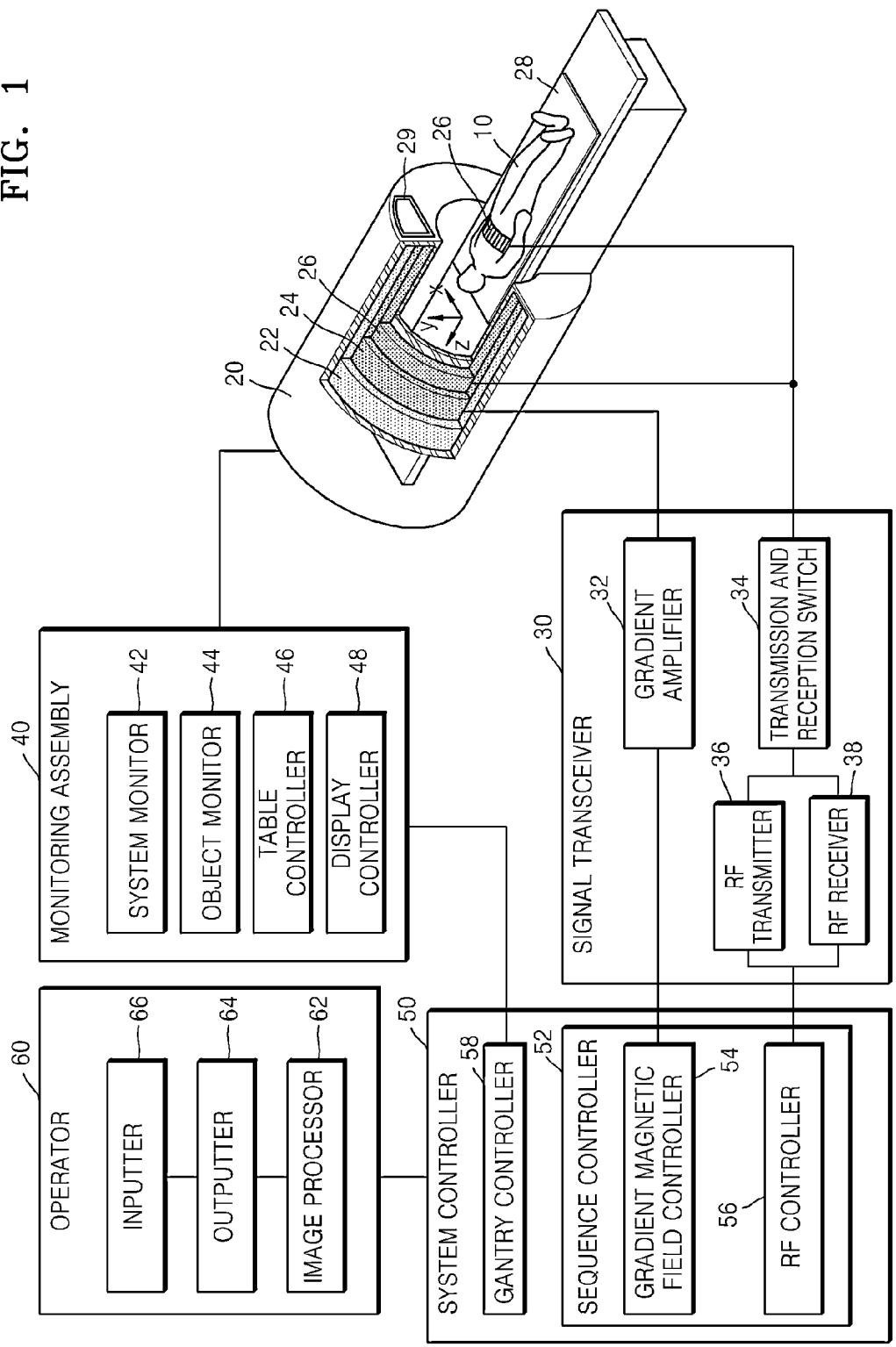
FIG. 1 is a schematic diagram of a magnetic resonance imaging (MRI) system according to an exemplary embodiment.

Exemplary embodiments will now be described more fully with reference to the accompanying drawings. The exemplary embodiments may, however, be embodied in many different forms and should not be construed as being limited to the exemplary embodiments set forth herein. Rather, these exemplary embodiments are provided so that this disclosure will be thorough and complete, and will fully convey the concept of the exemplary embodiments to those skilled in the art. The scope of the exemplary embodiments is defined only by the appended claims.

Terms used herein will now be briefly described and then the exemplary embodiments will be described in detail.

General terms widely used are selected while considering functions in one or more exemplary embodiments for terms used herein, but the terms used herein may differ according to the intentions of one of ordinary skill in the art, precedents, or emergence of new technologies. Also, in some cases, an applicant arbitrarily selects a term, and in this case, the meaning of the term will be described in detail in the detailed description of the exemplary embodiments. Accordingly, the terms shall be defined based on the meanings and details throughout the specification, rather than the simple names of the terms. Expressions such as "at least one of," when preceding a list of elements, modify the entire list of elements and do not modify the individual elements of the list.

When something "includes" a component, another component may be further included unless specified otherwise. The term "unit" used in the present specification refers to a software component, or a hardware component such as a field programmable gate array (FPGA) or an application specific-integrated circuit (ASIC), and performs a certain function. However, the "unit" is not limited to software or hardware. The "unit" may be configured in an addressable storage medium and may be configured to be executed by one or more processors. Hence, the "unit" includes elements such as software elements, object-oriented software elements, class elements, and task elements, and processes, functions, attributes, procedures, sub-routines, segments of program codes, drivers, firmware, micro-codes, circuits, data, databases, data structures, tables, arrays, and variables. The functions provided in the elements and the units may be combined into a fewer number of elements and units or may be divided into a larger number of elements and units.

While describing one or more exemplary embodiments, descriptions about drawings that are not related to the one or more exemplary embodiments are omitted. Exemplary embodiments will now be described more fully hereinafter with reference to the accompanying drawings so that they may be easily implemented by one of ordinary skill in the art. In addition, parts not related to the exemplary embodiments are omitted so that the description of exemplary embodiments will be clear.

In the present specification, an "image" may refer to multi-dimensional data composed of discrete image elements (e.g., pixels in a two-dimensional (2D) image and voxels in a three-dimensional (3D) image). For example, the image may include a medical image of an object acquired by using an X-ray, computed tomography (CT), magnetic resonance imaging (MRI), ultrasonic waves, or another medical image imaging apparatus.

Furthermore, in the present specification, an "object" may include a person or an animal, or a part of a person or an animal. For example, the object may include an organ such as a liver, a heart, a womb, a brain, a breast, or an abdomen, or a blood vessel. Furthermore, the "object" may include a phantom. A phantom means a material having a volume that is approximately close to the density and effective atomic number of a living thing, and may include a sphere phantom having a property similar to a human body.

Furthermore, in the present specification, a "user" refers to a medical professional, such as a doctor, a nurse, a medical laboratory technologist, and an engineer who repairs a medical apparatus, but the user is not limited thereto.

Furthermore, in the present specification, an "MR image" refers to an image of an object obtained by using a nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or time to echo (TE).

An MRI system is an apparatus for acquiring a sectional image of a part of an object by expressing, in a contrast comparison, a strength of a MR signal with respect to an RF signal generated in a magnetic field having a specific strength. For example, if an RF signal that resonates only a specific atomic nucleus (for example, a hydrogen atomic nucleus) is irradiated for an instant onto the object that is placed in a strong magnetic field and then the irradiation stops, an MR signal is emitted from the specific atomic nucleus, and thus the MRI system may receive the MR signal and acquire an MR image. The MR signal means an RF signal emitted from the object. An intensity of the MR signal may be determined according to a density of a predetermined atom (for example, hydrogen) included in the object, a relaxation time T1, a relaxation time T2, and a blood flow.

MRI systems include characteristics different from those of other imaging apparatuses. Unlike imaging apparatuses such as computed tomography (CT) apparatuses that acquire images dependent upon a direction of detecting hardware, MRI systems may acquire 2D images or 3D volume images that are oriented toward an arbitrary point. Since MRI systems may acquire images having high soft tissue contrast while not exposing objects and examinees to radiation, unlike CT apparatuses, X-ray apparatuses, position emission tomography (PET) apparatuses, and single photon emission CT (SPECT) apparatuses, the MRI systems may acquire neurological images, intravascular images, musculoskeletal images, and oncologic images in which it is important to clearly describe abnormal tissues.

FIG. 1 is a block diagram of an MRI system according to an exemplary embodiment. Referring to FIG. 1, a general MRI system may include a gantry 20, a signal transceiver 30, a monitoring assembly 40, a system controller 50, and an operator 60.

The gantry 20 blocks electromagnetic waves generated by a main magnet 22, a gradient coil 24, and an RF coil 26 from being externally emitted. A magnetostatic field and a gradient magnetic field are formed at a bore in the gantry 20, and an RF signal is irradiated towards an object 10, such as a patient.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning a direction of magnetic dipole moments of atomic nuclei in the object 10 in a constant direction. A precise and accurate MR image of the object 10 may be obtained when a magnetic field generated by the main magnet 22 is strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by inducing different resonance frequencies according to the regions of the object 10.

The RF coil 26 may irradiate an RF signal to the object and receive an MR signal emitted from the object. In detail, the RF coil 26 may transmit an RF signal at a same frequency as a precessional motion to the patient towards atomic nuclei in a precessional motion, stop transmitting the RF signal, and then receive an MR signal emitted from the object 10.

For example, in order to transit an atomic nucleus from a low energy state to a high energy state, the RF coil 26 may generate and apply an electromagnetic wave signal having an RF corresponding to a type of the atomic nucleus, for example, an RF signal, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Larmor frequency. In other words, when the electromagnetic wave signal applied to the atomic nucleus is stopped, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei in the object 10.

The RF coil 26 may be realized as an RF transmitting and receiving coil having both a function of generating electromagnetic waves having a wireless frequency corresponding to a type of an atomic nucleus and a function of receiving electromagnetic waves emitted from an atomic nucleus. Alternatively, the RF coil 26 may be realized as a transmission RF coil having a function of generating electromagnetic waves having a wireless frequency corresponding to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to the structure which is used.

The RF coil 26 may be a transmission exclusive coil, a reception exclusive coil, or a transmission and reception coil according to the method of transmitting and receiving an RF signal which are used.

The RF coil 26 may include an RF coil in any one of various kinds of channels, such as 16 channels, 32 channels, 72 channels, and 144 channels.

It is hereinafter assumed that the RF coil 26 is an RF multi-coil including N coils corresponding to multiple channels, i.e., first through N-th channels. Here, an RF multi-coil may also be referred to as a multi-channel RF coil.

The gantry 20 may further include a display 29 which is disposed outside of the gantry 20 and a display (not shown) which is disposed inside of the gantry 20. The gantry 20 may provide predetermined information to the user or the object through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 in the gantry 20, and may supply a pulse signal for generating a gradient magnetic field to the gradient coil 24 according to control of a gradient magnetic field controller 54. By controlling the pulse signal supplied from the gradient amplifier 32 to the gradient coil 24, gradient magnetic fields in X-, Y-, and Z-axis directions may be composed.

The RF transmitter 36 and the RF receiver 38 may drive the RF coil 26. The RF transmitter 36 may supply an RF pulse having a Larmor frequency to the RF coil 26, and the RF receiver 38 may receive an MR signal received from the RF coil 26.

The transmission and reception switch 34 may adjust transmission and reception directions of the RF signal and the MR signal. For example, the RF signal may be irradiated to the object 10 through the RF coil 26 during a transmission mode, and the MR signal may be received by the object 10 through the RF coil 26 during a reception mode. The transmission and reception switch 34 may be controlled by a control signal from an RF controller 56.

The monitoring assembly 40 may monitor or control the gantry 20 or devices mounted on the gantry 20. The monitoring assembly 40 may include a system monitor 42, an object monitor 44, a table controller 46, and a display controller 48.

The system monitor 42 may monitor and control a state of a magnetostatic field, a state of a gradient magnetic field, a state of an RF signal, a state of the RF coil 26, a state of the table 28, a state of a device for measuring body information of the object 10, a power supply state, a state of a thermal exchanger, and a state of a compressor.

The object monitor 44 monitors a state of the object 10. In detail, the object monitor 44 may include a camera for observing movement by the object 10 or a position of the object 10, a respiration measurer for measuring the respiration of the object 10, an electrocardiogram (ECG) measurer for measuring an ECG of the object 10, or a temperature measurer for measuring a temperature of the object 10.

The table controller 46 controls movement of the table 28 where the object 10 is positioned. The table controller 46 may control the movement of the table 28 according to a sequence control of a sequence controller 52. For example, during imaging of the object 10, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 and the display respectively outside and inside the gantry 20. In detail, the display controller 48 may turn the display 29 and the display inside of the gantry 20 on or off, and may control a screen which is output on the display 29 and the display inside of the gantry 20. Also, when a speaker is located inside or outside the gantry 20, the display controller 48 may turn the speaker on or off, or control the speaker to output sound.

The system controller 50 may include the sequence controller 52 for controlling a sequence of signals formed in the gantry 20, and a gantry controller 58 for controlling the gantry 20 and devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operator 60. Here, the pulse sequence includes all information required to control the gradient amplifier 32, the RF transmitter 36, the RF receiver 38, and the transmission and reception switch 34. Also, the pulse sequence may include information about a strength, an application time, and an application timing of a pulse signal that is applied to the gradient coil 24.

The operator 60 requests the system controller 50 to transmit pulse sequence information while controlling an overall operation of the MRI system.

The operator 60 may include an image processor 62 for processing an MR signal received from the RF receiver 38, an outputter 64, and an inputter 66.

The image processor 62 processes an MR signal received from the RF receiver 38 so as to generate MR image data of the object 10.

The image processor 62 performs any one of various signal processes, such as amplification, frequency transformation, phase detection, low frequency amplification, and filtering, on an MR signal received by the RF receiver 38.

The image processor 62 may arrange digital data in a k space of a memory, and rearrange the digital data into image data via 2D or 3D Fourier transformation.

The image processor 62 may also perform a composition process or a difference calculation process on image data if required. The composition process may include an addition process on a pixel or a maximum intensity projection (MIP) process. The image processor 62 may store not only rearranged image data but also image data on which a composition process or difference calculation process is performed, in a memory (not shown) or an external server.

Signal processes applied to MR signals by the image processor 62 may be performed in parallel. For example, a signal process may be performed on a plurality of MR signals received by a multi-channel RF coil in parallel so as to reconstruct the plurality of MR signals into image data.

The outputter 64 may output image data generated or rearranged by the image processor 62 to the user. Also, the outputter 64 may output information required for the user to manipulate the MRI system, such as a user interface (UI), user information, or object information. The outputter 64 may include a speaker, a printer, a cathode-ray tube (CRT) display, a liquid crystal display (LCD), a plasma display panel (PDP), an organic light-emitting diode (OLED) display, a field emission display (FED), a light-emitting diode (LED) display, a vacuum fluorescent display (VFD), a digital light processing (DLP) display, a primary flight display (PFD), a 3D display, or a transparent display, or any one of other various output devices that are well known to one of ordinary skill in the art.

The user may input object information, parameter information, a scan condition, a pulse sequence, or information about image composition or a difference calculation by using the inputter 66. The inputter 66 may include a keyboard, a mouse, a track ball, a voice recognizer, a gesture recognizer, or a touch screen, or any other various input devices that are well known to one of ordinary skill in the art.

The signal transceiver 30, the monitoring assembly 40, the system controller 50, and the operator 60 are separate components in FIG. 1, but it is obvious to one of ordinary skill in the art that functions of the signal transceiver 30, the monitoring assembly 40, the system controller 50, and the operator 60 may be performed by another component. For example, the image processor 62 may convert an MR signal received by the RF receiver 38 into a digital signal, but such a conversion to a digital signal may be directly performed by the RF receiver 38 or the RF coil 26.

The gantry 20, the RF coil 26, the signal transceiver 30, the monitoring assembly 40, the system controller 50, and the operator 60 may be connected to each other via wires or wirelessly, and when they are connected wirelessly to each other, the MRI system may further include an apparatus (not shown) for synchronizing clocks therebetween. Communications among the gantry 20, the RF coil 26, the signal transceiver 30, the monitoring assembly 40, the system controller 50, and the operator 60 may be performed by using a high-speed digital interface, such as low voltage differential signaling (LVDS), asynchronous serial communication, such as universal asynchronous receiver transmitter (UART), a low-delay network protocol, such as an error synchronous serial communication or controller area network (CAN), optical communication, or any other communication method that is well known to one of ordinary skill in the art.

Figure 2:
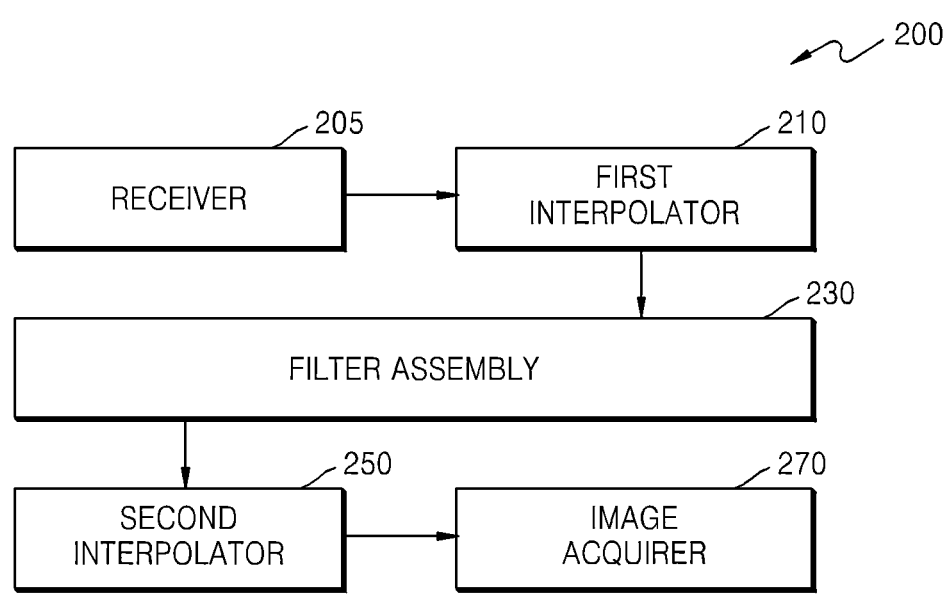
FIG. 2 is a diagram of an MRI apparatus according to an exemplary embodiment.

FIG. 2 is a diagram of an MRI apparatus 200 according to an exemplary embodiment, Referring to FIG. 2, the MRI apparatus 200 according to the present exemplary embodiment includes a first interpolator 210, a filter assembly 230, a second interpolator 250, and an image acquirer 270. The MRI apparatus 200 may further include a receiver 205. The MRI apparatus 200 may correspond to the image processor 62 described with reference to FIG. 1.

The MRI apparatus 200 is used to obtain an MR image by using data acquired by an RF multi-coil including a plurality of channel coils.

In detail, the MRI apparatus 200 may receive a plurality of data acquired by an RF coil (such as RF coil 26 in FIG. 1), that is an RF multi-coil including a plurality of channel coils, and generate an MR image by using the received plurality of data. The plurality of data received by the MRI apparatus 200 may be raw data generated in a K-space. The raw data may be undersampled K-space data which is a signal that is produced by arranging an RF signal received from each of the channel coils included in the RF multi-coil in the K-space.

The receiver 205 receives an RF signal acquired by the RF receiver (for example, RF receiver 38 in FIG. 1). In this case, the RF signal received by the receiver 205 may be K-space data received from a plurality of channel coils included in the RF coil 26. As described above, the RF coil 26 is an RF multi-coil including a plurality of coils corresponding to a plurality of channels, respectively. In detail, the RF coil 26 includes first through n-th channel coils, each channel coil receiving an RF signal. In this case, the RF receiver 38 may generate n raw data by arranging RF signals received from the RF coil 26 in the K space and transmit the n raw data to the receiver 205. The RF coil 26 is hereinafter referred to as an RF multi-coil.

Alternatively, the receiver 205 may directly receive RF signals acquired by the RF coil 26. In this case, the receiver 205 may produce n raw data corresponding to respective n channel coils by arranging the RF signals in the K-space.

A signal acquired by arranging RF signals received from n channel coils in the K-space is hereinafter called undersampled K-space data. The undersampled K-space data is a signal acquired before being calibrated, and is obtained by performing undersampling of the K-space at predetermined intervals. The undersampled K-space data will be described in detail below with reference to FIG. 4.

In the MRI apparatus 200, the receiver 205 may also be incorporated in the first interpolator 210. In this case, the first interpolator 210 may directly receive RF signals to thereby generate n undersampled K-space data, or may directly receive n undersampled K-space data.

The first interpolator 210 acquires a plurality of undersampled K-space data respectively corresponding to a plurality of channel coils included in an RF multi-coil, initializes the plurality of undersampled K-space data, and generates a plurality of first interpolation data. As described above, the first interpolator 210 may receive the undersampled K-space data from the receiver 205, or may directly receive RF signals acquired by a plurality of channel coils, respectively, to thereby generate n undersampled K-space data.

In detail, the first interpolator 210 may generate a plurality of first interpolation data by performing calibration on the plurality of undersampled K-space data. Hereinafter, the calibration performed by the first interpolator 210 is hereinafter called a first calibration.

The filter assembly 230 generates a plurality of filtered data by filtering the plurality of first interpolation data for each of a plurality of frequency bands. Here, the plurality of frequency bands may include a low frequency band and a high frequency band. The filter assembly 230 may include at least one low-pass filter and a plurality of high-pass filters.

In detail, the filter assembly 230 may output n low-pass filtered data by filtering n first interpolation data corresponding to n channel coils in a low frequency band. The filter assembly 230 uses m high-pass filters having different filter characteristics to high-pass filter n first interpolation data, thereby generating m high-pass filtered data sets. Here, one high-pass filtered data set includes n high-pass filtered data corresponding to the n channel coils.

The second interpolator 250 performs calibration by using at least one of a plurality of filtered data, to generate a plurality of second interpolation data respectively corresponding to a plurality of channel coils. In detail, the second interpolator 250 may perform calibration by using m high-pass filtered data sets, thereby generating n second interpolation data respectively corresponding to n channel coils. The calibration performed by the second interpolator 250 is hereinafter called a second calibration.

The image acquirer 270 acquires MR images by using a plurality of second interpolation data and filtered data corresponding to a predetermined frequency band from among a plurality of frequency bands. In detail, the image acquirer 270 acquires MR images by using low-pass filtered data and the plurality of second interpolation data.

In detail, the image acquirer 270 may combine each of n low-pass filtered data with each of n interpolation data for a corresponding one of n channels, thereby generating n MR images corresponding to n channel coils. In other words, the image acquirer 270 may simply combine low-pass filtered data and second interpolation data corresponding to a predetermined channel with each other to generate an MR image corresponding to the predetermined channel.

The image acquirer 270 may produce a final MR image by performing channel synthesization on n MR images.

Figure 3:
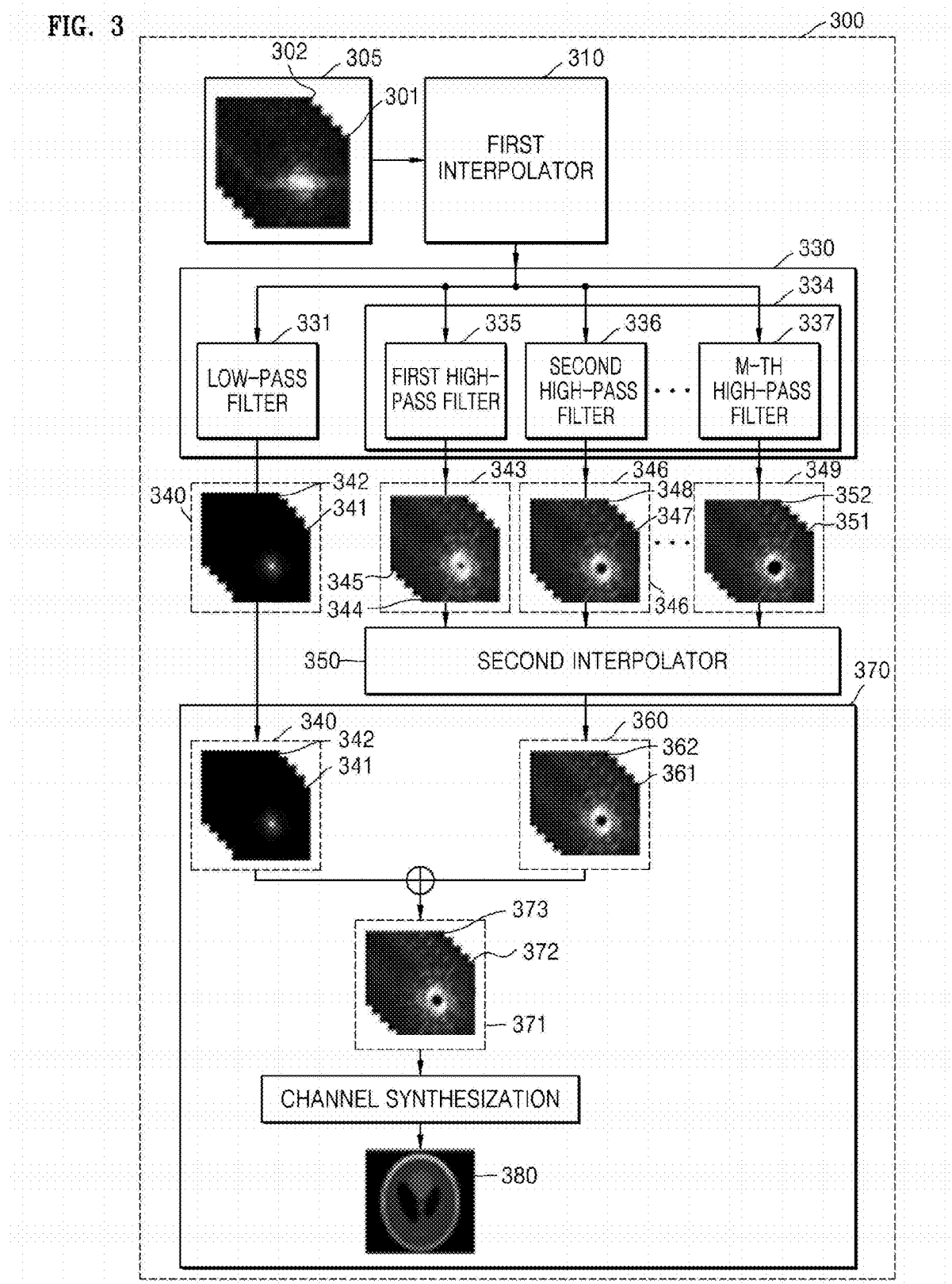
FIG. 3 is a diagram of an MRI apparatus according to another exemplary embodiment.

FIG. 3 is a diagram of an MRI apparatus 300 according to another exemplary embodiment. Referring to FIG. 3, the MRI apparatus 300 according to the present exemplary embodiment includes a first interpolator 310, a filter assembly 330, a second interpolator 350, and an image acquirer 370. The first interpolator 310, the filter assembly 330, the second interpolator 350, the image acquirer 370, and the receiver 305 in the MRI apparatus 300 have the same structures and functions as those of their counterparts illustrated in FIG. 2. Thus, the same descriptions as already presented with respect to FIG. 2 are omitted.

The receiver 305 may generate undersampled K-space data corresponding to n channel coils included in the RF coil 26. Alternatively, the receiver 305 may externally receive n undersampled K-space data corresponding to n channel coils. Otherwise, the receiver 305 may receive RF signals acquired by the respective n channel coils.

FIG. 3 illustrates an example where n undersampled K-space data are generated in the receiver 350. In FIG. 3, undersampled K-space data 301 and 302 arranged at the foremost and backmost positions are acquired by a first channel coil and an n-th channel coil, respectively.

The first interpolator 310 generates n first interpolation data by initializing n undersampled K-space data corresponding to n channel coils. In detail, the first interpolator 310 may generate n first interpolation data by performing calibration on the n undersampled K-space data.

In undersampled K-space data, line data is acquired at predetermined intervals. Data acquired at predetermined intervals are hereinafter referred to as 'acquired line data'. Line data acquired by setting a predetermined line in the K-space as a calibration line is hereinafter referred to as 'calibration line data.' Data located at missing lines are hereinafter referred to as 'missing line data.'

In detail, the first interpolator 310 calculates a spatial correlation coefficient by using acquired line data and calibration line data in the undersampled K-space data and estimates and acquires missing line data in the undersampled K-space data by using the spatial correlation coefficient. The first interpolator 310 then generates, based on the missing line data, first interpolation data that are initially restored K-space data.

Alternatively, in order to acquire the undersampled K-space data, the first interpolator 310 may acquire undersampled data at predetermined intervals from each of the n channel coils and data sampled at Nyquist sampling intervals from a low frequency region of a K-space. The first interpolator 310 may then combine the undersampled data with the data sampled at Nyquist sampling intervals to thereby acquire undersampled K-space data. In this case, the low frequency region of the K-space may be a central portion of the K-space.

The filter assembly 330 may include one low-pass filter 331 and a high-pass filter assembly 334 consisting of a plurality of high-pass filters. In FIG. 3, the high-pass filter assembly 334 includes first through m-th high-pass filters 335, 336 and 337.

The low-pass filter 331 outputs n low-pass filtered data corresponding to a low frequency band by low-pass filtering n first interpolation data corresponding to n channel coils.

Each of the first through m-th high-pass filters 335 through 337 outputs n high-pass filtered signals corresponding to a high frequency band by high-pass filtering n first interpolation data corresponding to the n channel coils.

In detail, each of the first through m-th high-pass filters 335 through 337 has different filter characteristics. The filter characteristics mean characteristics in which a frequency range and magnitude of a signal vary during filtering of a predetermined signal. Each of the first through m-th high-pass filters 335 through 337 has a different value in at least one characteristic such as a filtering period, a magnitude of an output signal, a cutoff frequency of a filter, and smoothness of a transition period in a filter characteristic curve.

For example, filter characteristics may vary according to a coefficient c that is used to adjust a cut-off frequency of a filter or a coefficient w that is used to adjust the smoothness of a transition period in a filter characteristic curve.

Filter characteristics of the low-pass filter 331 and the first through m-th high-pass filters 335 through 337 will now be described in detail with reference to FIG. 4.

Figure 4:
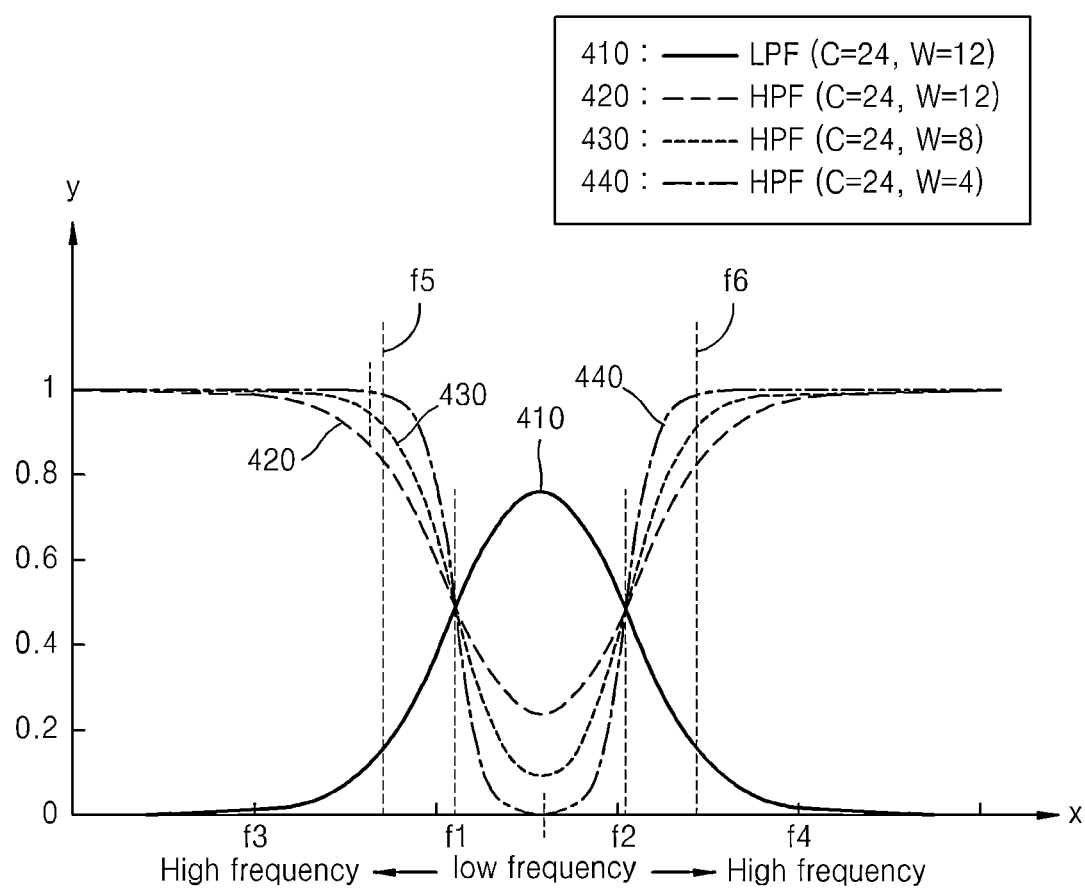
FIG. 4 is a graphical representation for explaining a filter assembly in the MRI apparatus of FIG. 3.

FIG. 4 is a graphical representation for explaining the filter assembly 330 illustrated in FIG. 3.

In the graphical representation of FIG. 4, the ordinate and abscissa denote an amplitude of a filtered signal and a frequency, respectively. The amplitude of the filtered signal is represented by 1 when the filtered signal maintains the same amplitude as an original signal and the amplitude of the filtered signal is represented by 0 when the original signal is blocked and not output. Furthermore, it is assumed in FIG. 4 that the high-pass filter assembly 334 includes three (3) high-pass filters (m=3).

Referring to FIG. 4, curve 410 and curve 420 represent filter characteristics of the low-pass filter 331 and the first high-pass filter 335, respectively. Curve 430 and curve 440 express filter characteristics of the second high-pass filter 336 and the third high-pass filter 337, respectively.

In one example, a signal value LPF that is output from the low-pass filter 331 and a signal value HPF that is output from each of the first through third high-pass filters 335 through 337 may be obtained by Equations (1) and (2), respectively:

$$LPF = \{1 + \exp\{(\sqrt{k_x^2 + k_y^2} - c)/w\}\}^{-1} - [1 + \exp\{(\sqrt{k_x^2 + k_y^2} + c)/w\}]^{-1}$$ Equation (1)

$$HPF = 1 - [1 + \exp\{(\sqrt{k_x^2 + k_y^2} - c)/w\}]^{-1} + [1 + \exp\{(\sqrt{k_x^2 + k_y^2} + c)/w\}]^{-1}$$ Equation (2)

where $K_x$ and $K_y$ denote signal values of the x- and y-coordinates of K-space data, respectively, c is a coefficient value for adjusting a cutoff frequency of a filter, and w is a coefficient value for adjusting smoothness of a transition period in a filter characteristic curve.

Equations (1) and (2) may be designed differently according to filter characteristics of the low-pass filter 331 and the first through third high-pass filters 335 through 337 included in the filter assembly 330.

Referring to FIG. 4 and Equation (1), the low-pass filter 331 passes a signal component in a low frequency band to output the signal component while blocking a signal component in a high frequency band. In the low-pass filter 331, a degree to which a signal in a high frequency band is blocked may vary according to the coefficient values c and w.

Referring to FIG. 4 and Equation (2), each of the first through third high-pass filters 335 through 337 blocks a signal in a low frequency band while passing and outputting a signal in a high frequency band. In each of the first through third high-pass filters 335 through 337, a degree to which a signal in a low frequency band is blocked may vary according to the coefficient values c and w.

In addition, a range of a low frequency band in which the low-pass filter 331 filters a signal may vary according to frequencies from f3 to f4 or frequencies from f1 to f2 which are filtering bands shown on the curve 410 representing filter characteristics of the low-pass filter 331. Furthermore, a range of a high frequency band in which each of the high-pass filters 335, 336, and 337 filters a signal may be determined as a frequency band equal to or greater than a predetermined frequency between frequencies f2 and f6 which are filtering bands shown on the curves 420, 430, and 440 respectively representing filter characteristics of the first through third high-pass filters 335 through 337.

Referring back to FIG. 3, low-pass filtered data 341 arranged at the foremost position from among data 340 output from the low-pass filter 331 denotes first low-pass filtered data corresponding to a first channel coil. Low-pass filtered data 342 arranged at the backmost position denotes n-th low-pass filtered data corresponding to an n-th channel coil.

Furthermore, high-pass filtered data 344 arranged at the foremost position from among a data set 343 output from the first high-pass filter 335 denotes first high-pass filtered data corresponding to a first channel coil. High-pass filtered data 345 arranged at the backmost position denotes n-th high-pass filtered data corresponding to an n-th channel coil.

Likewise, high-pass filtered data 347 arranged at the foremost position from among a data set 346 output from the second high-pass filter 336 denotes first high-pass filtered data corresponding to a first channel coil. High-pass filtered data 348 arranged at the backmost position denotes n-th high-pass filtered data corresponding to an n-th channel coil.

High-pass filtered data 351 arranged at the foremost position from among a data set 351 output from the m-th high-pass filter 337 denotes first high-pass filtered data corresponding to a first channel coil. High-pass filtered data 352 arranged at the backmost position denotes n-th high-pass filtered data corresponding to an n-th channel coil.

The second interpolator 350 may generate n second interpolation data 360 respectively corresponding to n channel coils by performing calibration using m high-pass filtered data sets 343, 346, and 349 output from the high-pass filter assembly 334.

The operation of the second interpolator 350 will now be described in more detail with reference to FIG. 5.

Figure 5:
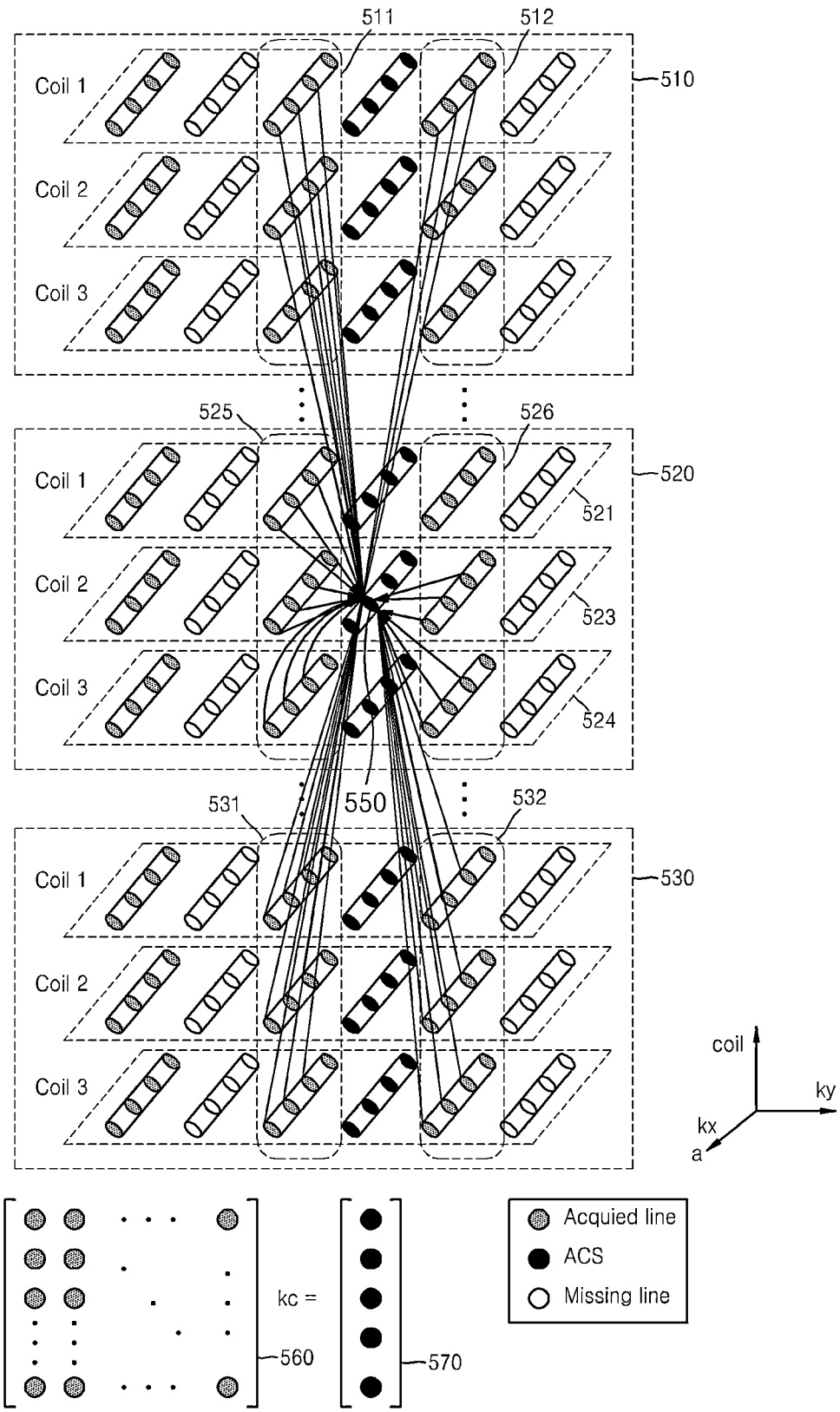
FIG. 5 is a diagram for explaining a second interpolator in the MRI apparatus of FIG. 3.

FIG. 5 illustrates the second interpolator 350 illustrated in FIG. 3.

Referring to FIG. 5, data 510, data 520, and data 530 respectively represent the data sets 343, 346, and 349 output by the first, the second, and the m-th high-pass filters 335, 336, and 337. Coil 1, Coil 2, and Coil 3 denote first through third channel coils, respectively. Data 521, data 523, and data 524 represent undersampled K-space data acquired by the first through third channel coils Coil 1 through Coil 3, respectively. In FIG. 5, an RF multi-coil includes the first through third channel coils Coil 1 through Coil 3.

The second interpolator 350 generates the n second interpolation data 360 corresponding to n channel coils by performing calibration on m high-pass filtered data sets 343, 346, and 349 output from the high-pass filter assembly 334.

In detail, the second interpolator 350 calculates a spatial correlation coefficient by performing calibration using the m high-pass filtered data sets 343, 346, and 349. The second interpolator 350 then acquires missing line data in undersampled K-space data by using the spatial correlation coefficient and generates the second interpolation data 360 by restoring K-space data based on the missing line data.

Referring to FIG. 5, in order to acquire a signal value 550 included in a calibration line of a predetermined channel, e.g., a second channel, signal values 525, 526, 511, 512, 531, and 532 are used. The signal values 525 and 526 are adjacent to the signal value 550 in a Ky direction within the same channel and adjacent channels, among the data 520 output from the second high-pass filter 336 that is the same high-pass filter. The signal values 511, 512, 531, and 532 are adjacent to the signal value 550 in the Ky direction within the same channel and adjacent channels, among the data 510 and 530 output from different high-pass filters, i.e., the first and m-th high-pass filters 335 and 337.

In detail, a spatial correlation coefficient Kc is calculated by using a right-hand-side value 570 of a matrix 560 which is the signal value 550 included in the calibration line of the second channel and left-hand-side values of the matrix which are the above-described signal values 511, 512, 525, 526, 531, and 532.

The second interpolator 350 may calculate a spatial correlation coefficient Kc by using inverse operations of a matrix as illustrated in FIG. 5 and estimate missing line data by using the spatial correlation coefficient Kc, to thereby generate n second interpolation data corresponding to n channel coils.

Referring back to FIG. 3, the image acquirer 370 combines the data 340 output from the low-pass filter 331 with the second interpolation data 360 for each of a plurality of channels, thereby acquiring a plurality of MR images respectively corresponding to the plurality of channels. In detail, the image acquirer 370 may combine the low-pass filtered data 340 corresponding to a first channel coil with high-pass filtered data corresponding to a first channel coil, thereby generating a first channel MR image 372 that is K-space data corresponding to a first channel. The image acquirer 370 may also combine the low-pass filtered data 342 corresponding to an n-th channel coil with high-pass filtered data 362 corresponding to an n-th channel coil, to thereby generate an n-th channel MR image 373 that is K-space data corresponding to an n-th channel. The image acquirer 370 may also combine the low-pass filtered data 341 corresponding to a first channel coil with high-pass filtered data 361 corresponding to a first channel coil, to thereby generate a first channel MR image 372 that is K-space data corresponding to a first channel.

The image acquirer 370 may transform n MR images 371 from a frequency domain into a spatial domain and then perform channel synthesization of the resulting n MR images, to thereby generate a final MR image 380. In detail, the image acquirer 370 performs an Inverse Fast Fourier Transform on the n MR images 371 and calculates the sum of squares of the resulting n MR images, thereby acquiring the final MR image 380.

Figure 6:
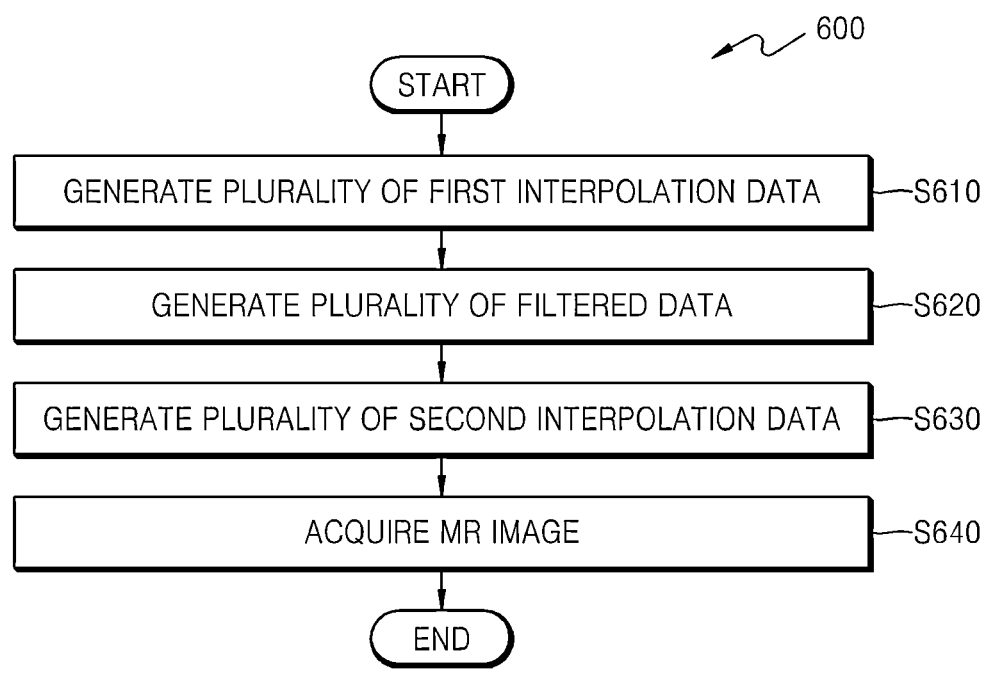
FIG. 6 is a flowchart of an MRI method according to an exemplary embodiment.

FIG. 6 is a flowchart of an MRI method 600 according to an exemplary embodiment. The MRI method 600 has the same technical concept as the MRI apparatuses 200 and 300 according to the exemplary embodiments described with reference to FIGS. 1 through 5. Thus, the same descriptions as already presented with respect to the MRI apparatuses 200 and 300 are omitted. Furthermore, since the MRI method 600 may be performed by using the MRI apparatus 200 of FIG. 2, the method 600 will now be described in detail with reference to FIGS. 2 and 6.

The MRI method 600 uses an RF multi-coil including a plurality of channel coils to generate an MR image.

Referring to FIGS. 2 and 6, a plurality of first interpolation data are generated by acquiring undersampled K-space data from each of a plurality of channel coils and initializing a plurality of undersampled K-space data (Operation S610). Operation S610 may be performed by the first interpolator 210.

A plurality of filtered data is generated by filtering the plurality of first interpolation data for each of a plurality of frequency bands (Operation S620). Operation S620 may be performed by the filter assembly 230.

A plurality of second interpolation data respectively corresponding to a plurality of channel coils may be generated by performing calibration on at least one data selected from the plurality of filtered data (Operation S630). Operation S630 may be performed by the second interpolator 250.

An MR image is acquired by using the plurality of second interpolation data and filtered data corresponding to a predetermined band from among the plurality of frequency bands (Operation S640). Operation S640 may be performed by the image acquirer 270.

Figure 7:
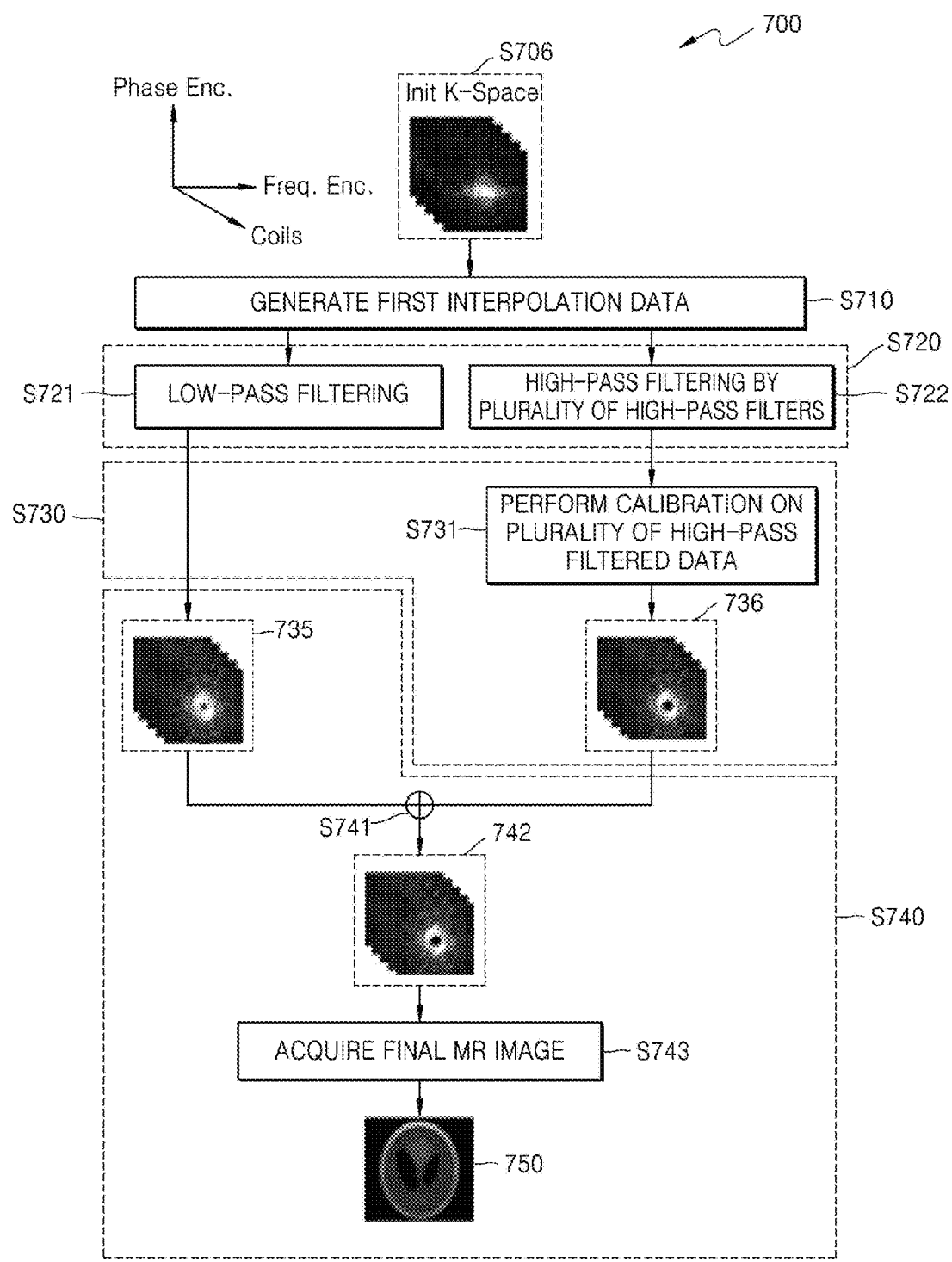
FIG. 7 is a diagram for explaining the MRI method shown in FIG. 6 in more detail.

FIG. 7 is a diagram illustrating an MRI method 700 to explain the MRI method 600 of FIG. 6 in more detail. Since Operations S710, S720, S730, and S740 illustrated in FIG. 7 correspond to Operations S610, S620, S630, and S640 illustrated in FIG. 6, respectively, the same descriptions as already presented with respect to the method 600 illustrated in FIG. 6 are omitted. The method has the same technical concept as the MRI apparatus 300 of FIG. 3, and may be performed by the MRI apparatus 300. The method 700 will now be described in detail with reference to FIGS. 3 and 7.

Referring to FIG. 7, a plurality of undersampled K-space data corresponding to a plurality of channel coils are received (Operation S705). Operation S705 may be performed by the receiver 305. Operation S705 may also be performed by the first interpolator 310, i.e., by directly receiving the undersampled K-space data.

A plurality of first interpolation data are generated by initializing the plurality of undersampled K-space data (Operation S710). Operation S710 may be performed by the first interpolator 310. In detail, a plurality of first interpolation data may be generated by performing calibration on the plurality of undersampled K-space data.

Operation S710 may include calculating a spatial correlation coefficient by using acquired line data and calibration line data in the undersampled K-space data, acquiring missing line data in the undersampled K-space data by using the spatial correlation coefficient, and generating first interpolation data, which are initially restored K-space data, based on the missing line data.

Alternatively, the undersampled K-space data may be acquired by acquiring undersampled data at predetermined intervals from each of the plurality channel coils and data sampled at Nyquist sampling intervals from a low frequency region of a K-space.

A plurality of filtered data are generated by filtering the plurality of first interpolation data for each of a plurality of frequency bands (Operation S720). Operation S720 may be performed by the filter assembly 330.

In detail, Operation S720 may include generating a plurality of low-pass filtered data 735 by low-pass filtering the plurality of first interpolation data using one low-pass filter 331 (Operation S721) and generating a plurality of high-pass filtered data by high-pass filtering the plurality of first interpolation data using the first through m-th high-pass filters 335 through 337 (Operation S722).

A plurality of second interpolation data 736 respectively corresponding to the plurality of channel coils are generated by performing calibration on the plurality of high-pass filtered data (Operation S730). Operation S730 may be performed by the second interpolator 350.

Operation S730 may include calculating a spatial correlation coefficient by performing calibration on the plurality of high-pass filtered data, acquiring missing line data in the undersampled K-space data by using the spatial correlation coefficient, and generating the plurality of second interpolation data 736 by restoring the K-space data based on the missing line data.

An MR image is generated by using the plurality of low-pass filtered data 735 and the plurality of second interpolation data 736 (Operation S740). Operation S740 may be performed by the image acquirer 370.

Operation S740 may include generating MR images 742 respectively corresponding to a plurality of channels by combining low-pass filtered data 735 with the second interpolation data 736 for each of the plurality of channels (Operation S741) and generating a final MR image 750 by performing an Inverse Fourier Transform, and in particular, an Inverse Fast Fourier Transform on the MR images 742 corresponding to the plurality of channels and performing channel synthesization of the resulting MR images (Operation S743).

Figure 8A:
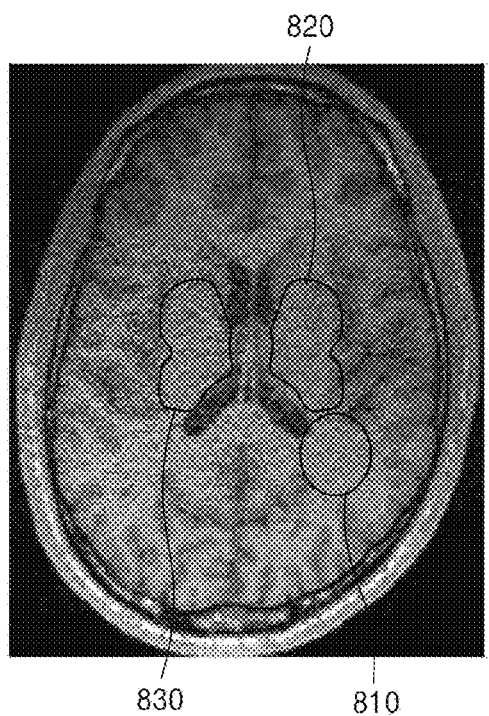
FIGS. 8A and 8B respectively illustrate an MR image acquired by using a Generalized Auto-calibrating Partially Parallel Acquisition (GRAPPA) technique and an MR image acquired by an MRI apparatus according to an exemplary embodiment.
Figure 8B:
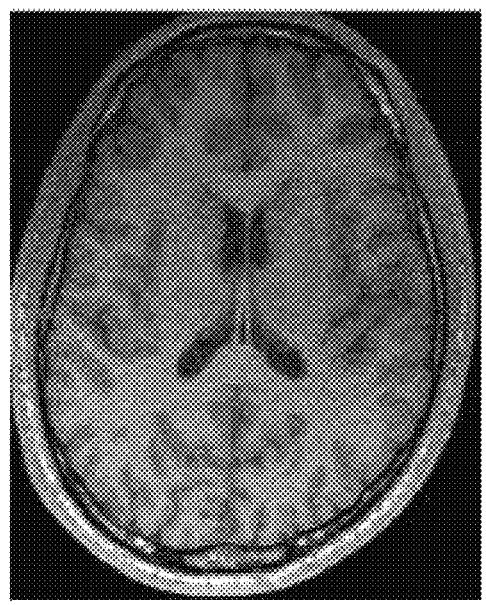

FIGS. 8A and 8B respectively illustrate an MR image acquired by using a Generalized Auto-calibrating Partially Parallel Acquisition (GRAPPA) technique and an MR image acquired by an MRI apparatus according to an exemplary embodiment.

As described above, in MRI apparatuses and methods according to the above exemplary embodiments, a final MR image is generated by using an image that is output from a low-pass filter after performing calibration on undersampled K-space data and low-pass filtering the resulting data, thereby reducing the level of residual aliasing artifacts that may occur in an image during reconstruction of data in a low frequency region.

Furthermore, in the MRI apparatuses and methods according to the one or more of the above exemplary embodiments, a final MR image is generated by using an image output from a plurality of high-pass filters, thereby suppressing noise amplification during reconstruction of data in a high frequency region. In detail, an accurate spatial correlation coefficient may be acquired by performing calibration on high-pass filtered data again. Furthermore, missing line data may be restored by using the accurate spatial correlation coefficient, thereby increasing the accuracy of reconstruction of an MR image.

In the MRI apparatuses and methods according to the above exemplary embodiments, MR images corresponding to a plurality of channel coils are acquired by combining low-pass filtered data with second interpolation data, thereby suppressing amplified noise in a high frequency region while maintaining the accuracy of reconstruction in a low frequency region.

Thus, the MRI apparatuses and methods according to the exemplary embodiments may improve the quality of a finally acquired MR image.

FIG. 8A illustrates an MR image acquired by using a general GRAPPA technique, and FIG. 8B illustrates an MR image acquired by using the MRI apparatuses and methods according to the exemplary embodiments.

As apparent from FIG. 8A, the MR image finally reconstructed according to the general GRAPPA technique has residual aliasing artifacts 820 and 830 and amplified noise 810. On the other hand, referring to FIG. 8B, the MR image acquired by the MRI apparatuses and methods according to the exemplary embodiments exhibits a lower level of residual aliasing artifacts and lower noise than the MR image illustrated in FIG. 8A.

Figure 9:
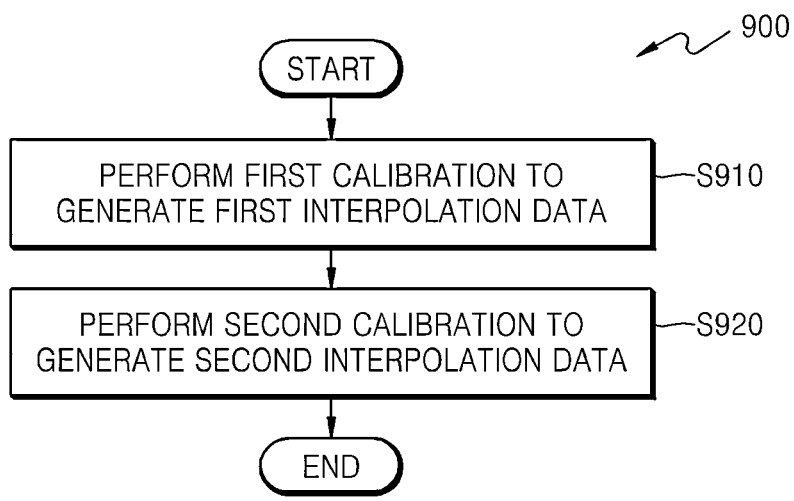
FIG. 9 is a flowchart of an MRI method according to another exemplary embodiment.

FIG. 9 is a flowchart of an MRI method 900 according to another exemplary embodiment. Since Operations S910 and S920 correspond to Operations S710 and S731 illustrated in FIG. 7, the same descriptions as already presented with respect to the method 700 illustrated in FIG. 7 are omitted.

According to the method 900, an MR image is generated using an RF multi-coil including a plurality of channel coils.

Referring to FIGS. 3 and 9, a plurality of first interpolation data are generated by initializing a plurality of undersampled K-space data acquired by the plurality of channel coils (Operation S910). Operation S910 may be performed by the first interpolator 310. A plurality of first interpolation data may be generated by performing calibration on the plurality of undersampled K-space data.

A plurality of second interpolation data are generated by performing calibration on a plurality of filtered data obtained by filtering the first interpolation data generated in Operation S910 using the first through m-th high-pass filters 335 through 337 (Operation S920). Operation S920 may be performed by the second interpolator 350.

According to the method 900, a spatial correlation coefficient is calculated by performing a second calibration on a plurality of high-pass filtered data that are acquired by high-pass filtering K-space data restored by performing a first calibration, thereby increasing the accuracy of the spatial correlation coefficient. Thus, the accuracy in reconstructing the missing line data for a subsequent process may be increased.

The exemplary embodiments can be recorded as programs that can be executed on a computer and be implemented through general-use digital computers that execute the programs using a computer-readable recording medium. Examples of the computer-readable recording medium include magnetic storage media (e.g., ROM, floppy disks, hard disks, etc.), optical recording media (e.g., CD-ROMs or DVDs), carrier waves (e. g., transmission through the Internet), etc.

While the exemplary embodiments have been particularly shown and described, it will be understood by those of ordinary skill in the art that various changes in form and details may be made therein without departing from the spirit and scope as defined by the following claims. Thus, the exemplary embodiments described above should be considered in a descriptive sense only and not for purposes of limitation.

What is claimed is:

1. A magnetic resonance imaging (MRI) apparatus comprising:
    a receiver configured to obtain a plurality of undersampled K-space data respectively corresponding to plurality of channel coils included in a radio frequency (RF) multi-coil; and
    an image processor configured to:
        initialize the plurality of undersampled K-space data, to generate a plurality of first interpolation data;
        generate a plurality of low-pass filtered data and a plurality of high-pass filtered data by filtering the plurality of first interpolation data for each of a low frequency band and a high frequency band;
        perform calibration using at least one high-pass filtered data that is selected from the plurality of high-pass filtered data, to generate a plurality of second interpolation data respectively corresponding to the plurality of channel coils; and
        obtain a final MR image using the plurality of second interpolation data and the plurality of low-pass filtered data.

2. The apparatus of claim 1, wherein the image processor includes:
    a low-pass filter configured to generate the plurality of low-pass filtered data by low-pass filtering the plurality of first interpolation data; and
    a high-pass filter assembly including a plurality of high-pass filters, wherein each of the plurality of high-pass filters generate a plurality of high-pass filtered data including the plurality of high-pass filtered data by high-pass filtering the plurality of first interpolation data.

3. The apparatus of claim 2, wherein the plurality of high-pass filters included in the high pass filter assembly have different filter characteristics.

4. The apparatus of claim 2, wherein the image processor is further configured to:
    performing the calibration using the plurality of high-pass filtered data to calculate a spatial correlation coefficient, obtain missing line data among the plurality of undersampled K-space data using the spatial correlation coefficient, and
generate the plurality of second interpolation data that is K-space data that are restored using the missing line data.

5. The apparatus of claim 4, wherein the image processor is further configured to combine the plurality of low-pass filtered data with the plurality of second interpolation data for each of a plurality of channels, to obtain MR images respectively corresponding to the plurality of channels.

6. The apparatus of claim 5, wherein the image processor is further configured to perform an Inverse Fourier Transform on the MR images respectively corresponding to the plurality of channels, and perform channel synthesization of the MR images on which the Inverse Fourier Transform is performed, to generate the final MR image.

7. The apparatus of claim 1, wherein the image processor is further configured to:
calculate a spatial correlation coefficient using obtained line data and calibration line data among the plurality of undersampled K-space data;
obtain missing line data among the plurality of undersampled K-space data using the spatial correlation coefficient; and
generate, based on the missing line data, the plurality of first interpolation data that is initially restored K-space data.

8. The apparatus of claim 1, wherein the image processor is further configured to:
obtain first data that is undersampled at predetermined intervals from each of the plurality of channel coils;
obtain second data that is sampled at Nyquist sampling intervals from a low frequency region of a K-space; and
combine the first data with the second data, to obtain the plurality of undersampled K-space data.

9. A magnetic resonance imaging (MRI) apparatus comprising:
a first interpolator configured to initialize a plurality of undersampled K-space data that is obtained respectively from a plurality of channel coils included in a radio frequency (RF) multi-coil, to generate a plurality of first interpolation data;
a low-pass filter configured to low-pass filter the plurality of first interpolation data to generate a plurality of low-pass filtered data;
a high-pass filter assembly including a plurality of high-pass filters, wherein each of the plurality of high-pass filters is configured to high-pass filter the plurality of first interpolation data to generate a plurality of high-pass filtered data; and
a second interpolator configured to perform calibration using the plurality of high-pass filtered data to generate a plurality of second interpolation data.

10. A magnetic resonance imaging (MRI) method using a radio frequency (RF) multi-coil including a plurality of channel coils, the method comprising:
obtaining a plurality of undersampled K-space data respectively from the plurality of channel coils, and initializing the plurality of undersampled K-space data, to generate a plurality of first interpolation data;
generating a plurality of low-pass filtered data and a plurality of high-pass filtered data by filtering the plurality of first interpolation data for each of a low frequency band and a high frequency band;
performing calibration using at least one high-pass filtered data that is selected from the plurality of high-pass filtered data, to generate a plurality of second interpolation data respectively corresponding to the plurality of channel coils; and
obtaining a final MR image using the plurality of second interpolation data and the plurality of low-pass filtered data.

11. The method of claim 10, wherein the generating the plurality of low-pass filtered data and the plurality of high-pass filtered data comprises:
generating the plurality of low-pass filtered data by low-pass filtering the plurality of first interpolation data by using a low-pass filter; and
generating a plurality of high-pass filtered data including the plurality of high-pass filtered data by high-pass filtering the plurality of first interpolation data by using a plurality of high-pass filters.

12. The method of claim 11, wherein the performing calibration comprises:
performing the calibration using the plurality of high-pass filtered data to calculate a spatial correlation coefficient;
obtaining missing line data among the plurality of undersampled K-space data using the spatial correlation coefficient; and
generating the plurality of second interpolation data that is K-space data that is restored using the missing line data.

13. The method of claim 12, wherein the obtaining the final MR image comprises combining the plurality of low-pass filtered data with the plurality of second interpolation data for each of a plurality of channels, to obtain MR images respectively corresponding to the plurality of channels.

14. The method of claim 13, wherein the obtaining the final MR image further comprises:
performing an Inverse Fourier Transform on the MR images respectively corresponding to the plurality of channels; and
performing channel synthesization of the MR images on which the Inverse Fourier Transform is performed, to generate the final MR image.

15. The method of claim 10, wherein the method further comprises:
generating the plurality of first interpolation data,
the generating the plurality of first interpolation data comprises:
calculating a spatial correlation coefficient, using obtained line data and calibration line data among the plurality of undersampled K-space data;
obtaining missing line data among the plurality of undersampled K-space data, using the spatial correlation coefficient; and
generating, based on the missing line data, the plurality of first interpolation data that is initially restored K-space data.

16. The method of claim 10, wherein the obtaining the plurality of undersampled K-space data comprises:
obtaining first data that is undersampled at predetermined intervals from each of the plurality of channel coils;
obtaining second data that is sampled at Nyquist sampling intervals from a low frequency region of a K-space; and
combining the first data with the second data, to obtain the plurality of undersampled K-space data.

17. A magnetic resonance imaging (MRI) method using a radio frequency (RF) multi-coil including a plurality of channel coils, the method comprising:

initializing a plurality of undersampled K-space data that is obtained respectively from the plurality of channel coils, to generate a plurality of first interpolation data;

low-pass filtering, by a low-pass filter, the plurality of first interpolation data to generate a plurality of low-pass filtered data;

high-pass filtering, by each of a plurality of high-pass filters, the plurality of first interpolation data to generate a plurality of high-pass filtered data; and performing calibration using the plurality of high-pass filtered data, to generate a plurality of second interpolation data.

\* \* \* \* \*